United States Patent [19]

Russell

[11] Patent Number: 5,396,701
[45] Date of Patent: Mar. 14, 1995

[54] METHOD FOR PACKAGING AN INTEGRATED CIRCUIT

[75] Inventor: Ernest J. Russell, Richmond, Tex.

[73] Assignee: Texas Instruments Inc., Dallas, Tex.

[21] Appl. No.: 85,691

[22] Filed: Jun. 29, 1993

[51] Int. Cl.6 ............................................. H05K 3/30
[52] U.S. Cl. ........................................ 29/832; 29/827; 29/840; 228/180.1; 437/220
[58] Field of Search ........................ 29/827, 832, 840; 228/180.1; 437/220

[56] References Cited

U.S. PATENT DOCUMENTS 5,156,983  10/1992  Schlesinger et al. ............ 437/220 X

FOREIGN PATENT DOCUMENTS 5-144883  6/1993  Japan ................................. 228/180.1

Primary Examiner—Carl J. Arbes
Attorney, Agent, or Firm—William W. Holloway; Lawrence J. Bassuk; Richard L. Donaldson

[57] ABSTRACT

The present invention provides a modular electronic component (10) wherein a sequence of leads (26) of a lead frame (12) differs from a sequence of bonding pads (16) on an integrated circuit (14). When lead frame (12) is placed adjacent integrated circuit (14), first and second power buses (22) and (24) are disposed on a first side (18) of bonding pads (16). First portion (30) of leads (26) and lead finger (28) are disposed on second side (20) of bonding pads (16). Bonding members (42) couple appropriate bonding pads (16) with corresponding leads (26), first and second power buses (22) and (24), and lead finger (28). In this manner, the pin out of modular electronic component (10) may be altered by incorporating appropriate lead fingers (28) without changing the sequence of bonding pads (16).

5 Claims, 2 Drawing Sheets

METHOD FOR PACKAGING AN INTEGRATED CIRCUIT

TECHNICAL FIELD OF THE INVENTION

This invention relates in general to the field of electronic devices, and more particularly to a method and apparatus for packaging an integrated circuit.

BACKGROUND OF THE INVENTION

Many modern electronic systems incorporate various modular electronic components. For example, personal computers may comprise modular electronic components in the form of Dynamic Random Access Memory units. Each of the modular electronic components may comprise an integrated circuit fabricated on a semiconductor substrate. Each modular electronic component is coupled to the electronic system by a series of pins extending in a predetermined sequence from a body of the modular electronic component. The pins are coupled to leads of a lead frame. The lead frame is coupled to the integrated circuit during the fabrication of the modular electronic component.

A specific electronic signal may be associated with each pin of the modular electronic component. When the modular electronic component is properly coupled to the electronic system, the pins transmit these electronic signals between the integrated circuit and corresponding lines of the electronic system. Thereby, the electronic system may function properly. If, however, the sequence of pins of the modular electronic component does not match a sequence of corresponding lines of the electronic system, the electronic system will not receive the proper signals at the proper lines. Therefore, the electronic system would not function properly.

One typical method for connecting the lead frame to the integrated circuit is referred to in the industry as lead frame-over-chip (LOC) technology. As mentioned above, the integrated circuit is typically fabricated on a semiconductor substrate. The integrated circuit and substrate is commonly known as an "integrated circuit chip." The integrated circuit also comprises a row of bonding pads for connecting the integrated circuit to the leads of the lead frame. According to LOC technology, the lead frame is placed over the integrated circuit chip such that the row of bonding pads may be coupled to appropriate leads of the lead frame.

Typically, the leads of a lead frame may be routed in only 2 dimensions. This means that leads may not cross over other leads. Consequently, the sequence of leads in a lead frame will be the same as the sequence of the bonding pads on the integrated circuit. Integrated circuits are manufactured by a number of different companies. Often, each of these companies produce competing integrated circuits that perform the same function. However, the various integrated circuits differ in the manner in which the integrated circuits are organized on the semiconductor substrate. For example, because integrated circuits are complicated and designed independently by these companies, the sequence of bonding pads may vary from manufacturer to manufacturer even though the integrated circuits perform the same function. Therefore, each modular component produced by a particular manufacturer may have a different "pin out." A "pin out" is the physical sequence in which pins associated with specific electronic signals extend from the modular electronic component.

Two modular components that perform the same function but have different pin outs will not both function properly when coupled to a specific electronic system. At least one of the modular components will not provide the appropriate electronic signals to the system. This is contrary to the interchangeability that modular components should provide. A prior solution involves adding a few semiconductor processing operations to change the sequence of bonding pads of an existing integrated circuit design. In this manner, the bonding pads may be formed in the same sequence as the leads of the lead frame.

SUMMARY OF THE INVENTION

In accordance with the present invention, a method and apparatus for packaging integrated circuits is provided which substantially eliminates or reduces disadvantages and problems associated with prior methods. More specifically, the present invention provides a lead frame for use with packaging an integrated circuit having a plurality of bonding pads forming a row. The lead frame comprises first and second power buses, a plurality of leads, and at least one lead finger. The first and second power buses are parallel along a portion of the power buses. When the lead frame is placed adjacent to the integrated circuit, the parallel portion of the power buses is disposed adjacent to a first side of the row of bonding pads such that the power buses are parallel to the bonding pads. Additionally, when the lead frame is placed adjacent to the integrated circuit, the leads are disposed adjacent to a second side of the row of bonding pads. The lead finger is coupled to an end portion of one of the leads. Each of the leads and the lead fingers are adjacent to an appropriate bonding pad. The leads extend away from the row of bonding pads and are operable to couple the integrated circuit to an external system.

A technical advantage of the present invention inheres in the fact that it provides a lead frame wherein the sequence of leads extending from the lead frame may be different from the sequence of corresponding bonding pads of the integrated circuit. Thereby, the present invention allows a modular electronic component to be fabricated to have various pin outs even though the bonding pads are not in the same sequence as the leads. In this manner, a manufacturer of a particular integrated circuit may match the pin out of another manufacturer of a similar integrated circuit by simply varying the lead frame.

Another technical advantage of the present invention inheres in the fact that it allows a manufacturer of an integrated circuit to improve the design and layout of the integrated circuit without interfering with the ability of the manufacturer to meet a pin out requirement that is standard to the industry.

Another technical advantage of the present invention inheres to the fact that it allows various manufacturers of similar integrated circuits to provide their devices to the consumer with a common pin out.

Another technical advantage of the present invention inheres in the fact that it allows a manufacturer to inexpensively modify the pin out of a modular electronic component. By implementing the teachings of the present invention, the pin out can be changed without redesigning the underlying integrated circuit to change the sequence of the bonding pads.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
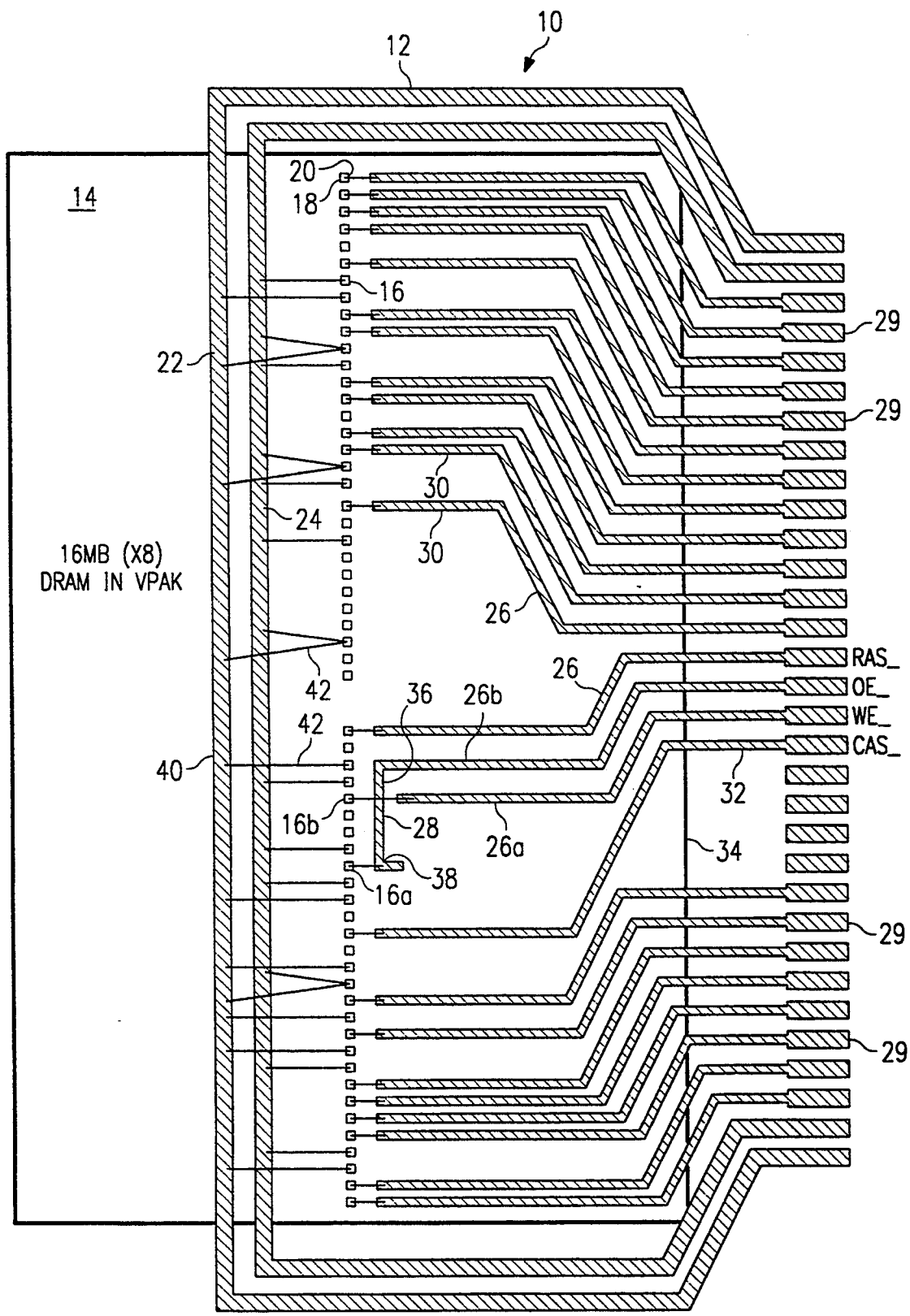
FIG. 1 is a schematic diagram of a lead frame constructed according to the teachings of the present invention for use with a 16 megabyte by 8 Dynamic Random Access Memory (DRAM) in a vertical package.

FIG. 1 is a schematic diagram of a modular electronic component indicated generally at 10 and constructed according to the teachings of the present invention. Modular electronic component 10 comprises a lead frame 12 and an integrated circuit 14.

Integrated circuit 14 may comprise, for example, a Dynamic Random Access Memory (DRAM), or other suitable integrated circuit. In this embodiment, integrated circuit 14 comprises a 16 megabyte by 8 DRAM. Integrated circuit 14 comprises a row of bonding pads 16 spaced along a length of integrated circuit 14. Bonding pad 16 have first and second sides 18 and 20. In order to simplify the schematic diagram to better illustrate the teachings of the present invention, various details of integrated circuit 14 are not shown in FIG. 1.

Lead frame 12 comprises first bus 22, second bus 24, a plurality of leads 26, a lead finger 28 and pins 29. Leads 26 have first and second portions 30 and 32. When lead frame 12 is placed adjacent integrated circuit 14, first portion 30 of leads 26 is disposed adjacent to second side 20 of bonding pads 16. In this manner, leads 26 extend away from second side 20 of bonding pads 16 toward side 34 of integrated circuit 14. Pins 29 are coupled to second portion 32 of leads 26. Pins 29 are operable to couple modular electronic component 10 to an electronic system (not shown) by using a surface mount technology, or other suitable conventional mounting technology. Pins 29 may comprise, for example, 32 pins as shown in FIG. 1, or other appropriate number of pins, as required by a specific integrated circuit 14.

Lead finger 28 comprises first and second portions 36 and 38. First portion 36 of lead finger 28 is coupled to a first portion 30 of lead 26b. In this manner, second portion 38 of lead finger 28 is deposed adjacent an appropriate bonding pad 16. Additionally, lead finger 28 is substantially parallel to bonding pads 16 when lead frame 12 is placed adjacent integrated circuit Alternatively, lead frame 12 may comprise more than one lead finger 28 to allow for proper coupling of bonding pads 16 to leads 26. In this manner, modular electronic component 10 may be provided with a sequence of pins 29 different from a sequence of bonding pads 16 of integrated circuit 14.

First and second power buses 22 and 24 are substantially parallel along a portion 40 of first and second power buses 22 and 24. First and second power buses 22 and 24 may be coupled to appropriate pins 29 to provide power to integrated circuit 14. When lead frame 12 is placed adjacent to integrated circuit 14, portion 40 of first and second power buses 22 and 24 is disposed adjacent first side 18 of bonding pads 16.

Finally, bonding members 42 couple bonding pads 16 with first power bus 22, second power bus 24, leads 26, and lead finger 28. Bonding members 42 may be fabricated to couple a bonding pad 16 to first power bus 22 even though second power bus 24 is located between first power bus 22 and bonding pad 16. This is known in the industry as "boding over"a bus. Bonding member 42 actually forms an arc shape. This allows bonding member 42 to cross over second bus 24 without contacting second bus 24.

Modular electronic component 10 may be fabricated by first placing lead frame 12 adjacent integrated circuit 14. First and second power buses 22 and 24 of lead frame 12 are disposed adjacent first side 18 of bonding pads 16 along portion 40 of first and second power buses 22 and 24. Additionally, first portion 30 of leads 26 are disposed adjacent second side 20 of bonding pad 16. Finally, lead finger 28 is disposed along second side 20 of bonding pads 16 such that lead finger 28 is substantially parallel to bonding pads 16. With the lead frame in place, bonding pads 16 are coupled to first portion 30 of leads 26 and second portion 38 of lead finger 28 by bonding members 42. Bonding members 42 may be fabricated, for example, by a conventional ball and stitch bonding technique. Finally, modular electronic component 10 is encased in a housing (not shown) according to a conventional technique. For example, modular electronic component 10 may be exposed to a slurry of plastic particles and other appropriate constituents in a conventional molding technique.

As discussed previously, the sequence of bonding pads 16 in an integrated circuit 14 generally is the same as the sequence of leads 26 and corresponding pins 29. The present invention allows the sequence of leads 26 to be different from the sequence of bonding pads 16 of an integrated circuit 14 while still coupling appropriate leads 26 to appropriate bonding pads 16.

In the embodiment of FIG. 1, lead 26a and bonding pad 16b are associated with the signal $WE_{13}$. Additionally, lead 26b and bonding pad 16a are associated with signal $OE_{13}$. As shown in FIG. 1 bonding pads 16a and 16b are not fabricated in the same sequence as leads 26a and 26b. However, by constructing lead frame 12 according to the teachings of the present invention, lead 26a may be coupled to bonding pad 16b while lead 26b may be coupled to bonding pad 16a. Bonding pad 16b may be coupled to lead 26a by "bonding over" the single lead finger 28. Bonding pad 16a may be coupled to lead 26b by a bonding member 42 coupling bonding pad 16a to adjacent lead finger 28. In this manner, the pin out of modular electronic component 10 may be modified without changing the sequence of bonding pads 16 on integrated circuit 14.

Figure 2:
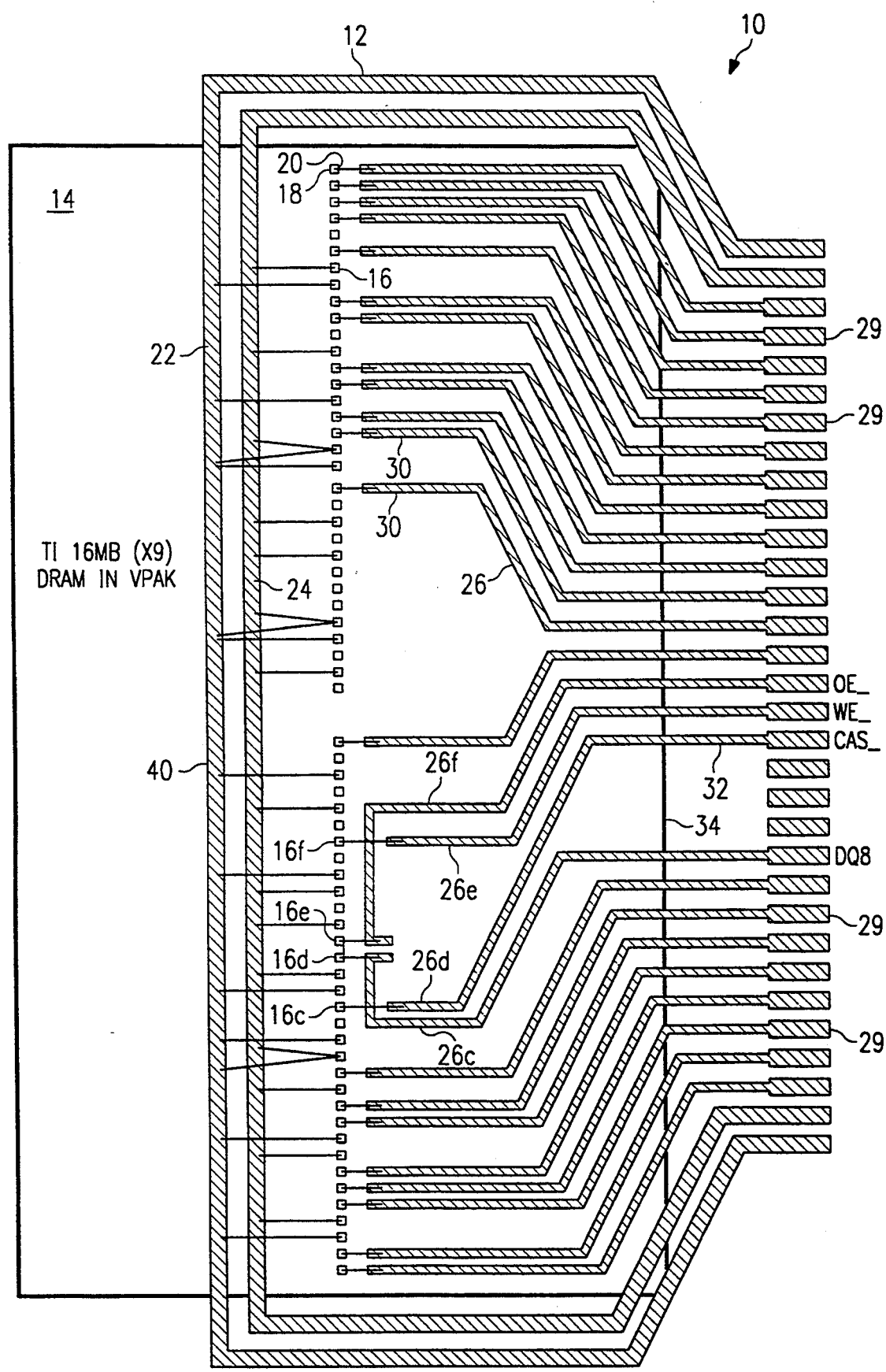
FIG. 2 is a schematic diagram of a lead frame constructed according to the teachings of the present invention for use with a 16 megabyte by 9 DRAM in a vertical package.

In FIG. 2, integrated circuit 14 is a 16 megabyte by 9 DRAM. In this embodiment, two leadfingers 28a and 28b are incorporated because two pair of bonding pads 16 are out of order. In this embodiment, lead 26c and bonding pad 16d are associated with the signal DQ8. Lead 26d and bonding pad 16c are associated with the signal $CAS_{13}$. Lead 26e and bonding pad 16f are associated with the signal $WE_{13}$. Finally, lead 26f and bonding pad 16e are associated with signal $OE_{13}$. As shown in FIG. 2 bonding pads 16c through 16f are not fabricated in the same sequence as leads 26c through 26f. However, by constructing lead frame 12 according to the teachings of the present invention, lead 26c may be coupled to bonding pad 16d while lead 26d may be coupled to bonding pad 16c. Furthermore, lead 26e may be coupled to bonding pad 16f while lead 26f may be coupled to bonding pad 16e. Bonding pads 16c and 16f may be coupled to leads 26d and 26e respectively by "bonding over" single lead fingers 28a and 28b. Bonding pads 16d and 16e may be coupled to leads 26c and 26f via adjacent lead fingers 28a and 28b. In this manner, the pin out of modular electronic component 10 may be modified without changing the sequence of bonding pads 16 on integrated circuit 14.

Although the present invention has been described in detail, it should be understood that various changes, substitutions and alterations can be made hereto without departing from the spirit and scope of the invention as defined by the appended claims. For example, the teachings of the present invention are applicable to zig-zag in-line packaging as well as vertical packaging.

What is claimed is:

1. A method for packaging an integrated circuit having a row of bonding pads, the method comprising the steps of:
    forming a lead frame including first and second power busses mutually parallel along a portion of said busses, a plurality of leads having first and second ends, and at least one lead finger having first and second ends;
    placing the lead frame adjacent the integrated circuit such that the portion of the first and second power buses is disposed adjacent a first side of the row of bonding pads, parallel to the bonding pads, the second end of the leads are disposed adjacent a second side of the row of bonding pads, and each of the leads and the lead fingers are adjacent an appropriate bonding pad.

2. The method of claim 1, and wherein the step of forming a lead frame comprises the steps of:
    forming first and second power buses, the first power bus being formed parallel to the second power bus along a portion of the power buses;
    forming a plurality of leads having first and second ends, the first end operable to couple the integrated circuit to an external system; and
    forming at least one lead finger having first and second ends, the first end coupled to the second end of one of the leads.

3. The method of claim 1, further comprising the step of forming bonding members to couple selected bonding pads to appropriate leads, the lead fingers, and the first and second power buses.

4. The method of claim 1, and further comprising the step of forming a plastic encasement for the integrated circuit by exposing the integrated circuit and the lead frame to a slurry of plastic particles in an appropriate mold.

5. The method of claim 1, and further comprising the step of forming bonding members according to a ball and stitch method to couple the leads, the lead fingers, and first and second power buses.

* * * * *